(12) United States Patent
Kam

(10) Patent No.: US 7,683,711 B2
(45) Date of Patent: Mar. 23, 2010

(54) VOLTAGE REGULATOR FOR BIASING CURRENT-TO-VOLTAGE AMPLIFIERS

(76) Inventor: Lup Yoong Kam, 23, Jalan Sempadan, #03-06 Villa Marina, Singapore (SG) 457399

( * ) Notice: Subject to any disclaimer, the term of this patent is extended or adjusted under 35 U.S.C. 154(b) by 6 days.

(21) Appl. No.: 11/946,999

(22) Filed: Nov. 29, 2007

(65) Prior Publication Data

US 2009/0140805 A1 Jun. 4, 2009

(51) Int. Cl.
*H03G 3/00* (2006.01)
(52) U.S. Cl. .................. 330/127; 330/129; 330/285
(58) Field of Classification Search ............... 330/127, 330/129, 136, 285, 297
See application file for complete search history.

(56) References Cited

U.S. PATENT DOCUMENTS 7,193,470 B2 * 3/2007 Lee et al. .................... 330/297

* cited by examiner

*Primary Examiner*—Khanh V Nguyen
(74) *Attorney, Agent, or Firm*—Conley Rose, P.C.

(57) ABSTRACT

A voltage regulator, comprising an analog amplifier, a noise filter and a signal compensator, is disclosed. The noise filter for receives a first signal containing alternating current (AC) noise in which the noise filter substantially filters the AC noise from the first signal to thereby produce a second signal. The voltage regulator regulates the second signal to thereby generate a third signal therefrom. The third signal is substantially noise-free and is provided as a biasing voltage to the analog amplifier. The first signal is further provided to for amplification by the analog amplifier based on amplification characteristics of the analog amplifier and the amplification characteristics of the analog amplifier is determined by the biasing voltage provided to the analog amplifier.

19 Claims, 3 Drawing Sheets

VOLTAGE REGULATOR FOR BIASING CURRENT-TO-VOLTAGE AMPLIFIERS

FIELD OF INVENTION

The invention relates generally to electronic amplifier circuits. More specifically, the present invention relates to a voltage regulator for biasing current-to-voltage amplifiers during operation thereof.

BACKGROUND

For high fidelity (Hi-Fi) audio reproduction from digital sources such as audio compact disc (CD), super-audio CD (SACD), DVD-audio (DVDA), and digital audio broadcasts (DAB) using digital audio reproduction equipment, the measured root-means-square (rms) values of analog signals provided by the digital audio reproduction equipment are typically approximately 2 volts. Digital-to-analog converters (DACs) are normally installed in the digital audio reproduction equipment for converting digital audio data retrieved from the digital sources into analog signals. The analog signals provided by modern DACs are either current-based or voltage-based. If the DACs provide current-based analog signals, then conversion of the current-based analog signals into the corresponding voltage equivalent is required before the analog signals are to be further provided to subsequent stage amplifiers.

A commonly used technique employs a circuit built with operational amplifiers (op-amps) thereon for such current-to-voltage conversion. As known to ordinary persons skilled in the art, the circuit is usually termed trans-impedance amplifier or current-to-voltage (I/V) amplifier. Conventionally, the circuit is configured such that the analog signals provided by the DAC bias the inverting input of the op-amp of the circuit and a voltage output is developed across a feedback resistor that is connected between the output of the op-amp to the inverting input of the op-amp. In such a configuration, the output of the DAC operates with respect to a virtual ground and the non-inverting input of the op-amp operates with respect to a reference ground. In addition, the circuit also operates with enabled negative feedback.

In general, for excellent Hi-Fi audio reproduction, circuits operating without negative feedback are highly desired to prevent the quality deterioration of the reproduced audio due to negative feedback. In addition, the circuits preferably operate in conformance with the operating characteristics of Class-A amplifiers for achieving low output impedance. Furthermore, operating the circuits to conform to performances of Class-A amplifiers is also essential for ensuring proper operation of the circuits regardless of the voltage characteristics of the power supply being provided to the circuits. Lastly, the absence of feedback loop circulating within the circuits is also desired. Regrettably, existing circuits are however unable to meet at least one of the foregoing criterion required for excellent audio reproduction.

SUMMARY

Embodiments of the invention disclosed herein provide a voltage regulator and a method for biasing current-to-voltage amplifiers in which alternating current (AC) signal feedbacks are substantially eliminated.

In accordance with a first aspect of the invention, there is disclosed a voltage regulator comprising an analog amplifier, a noise filter and a signal compensator. The noise filter receives a first signal containing alternating current (AC) noise, the noise filter substantially filtering the AC noise from the first signal to thereby produce a second signal. The signal compensator regulates the second signal to thereby generate a third signal therefrom. The third signal is substantially noise-free and is provided as a biasing voltage to the analog amplifier. The first signal is further provided to for amplification by the analog amplifier based on amplification characteristics of the analog amplifier and the amplification characteristics of the analog amplifier is determined by the biasing voltage provided to the analog amplifier.

In accordance with a second aspect of the invention, there is disclosed a voltage regulating method comprising providing an analog amplifier. Further, the method comprises receiving a first signal containing alternating current (AC) noise by a noise filter, the noise filter substantially filtering the AC noise from the first signal to thereby produce a second signal. Additionally, the method comprises regulating the second signal by a signal compensator to thereby generate a third signal therefrom. The third signal is substantially noise-free and is provided as a biasing voltage to the analog amplifier. The first signal is further provided to for amplification by the analog amplifier based on amplification characteristics of the analog amplifier and the amplification characteristics of the analog amplifier is determined by the biasing voltage provided to the analog amplifier.

BRIEF DESCRIPTION OF THE DRAWINGS

Embodiments of the invention are disclosed hereinafter with reference to the drawings, in which.

DETAILED DESCRIPTION

Figure 1:
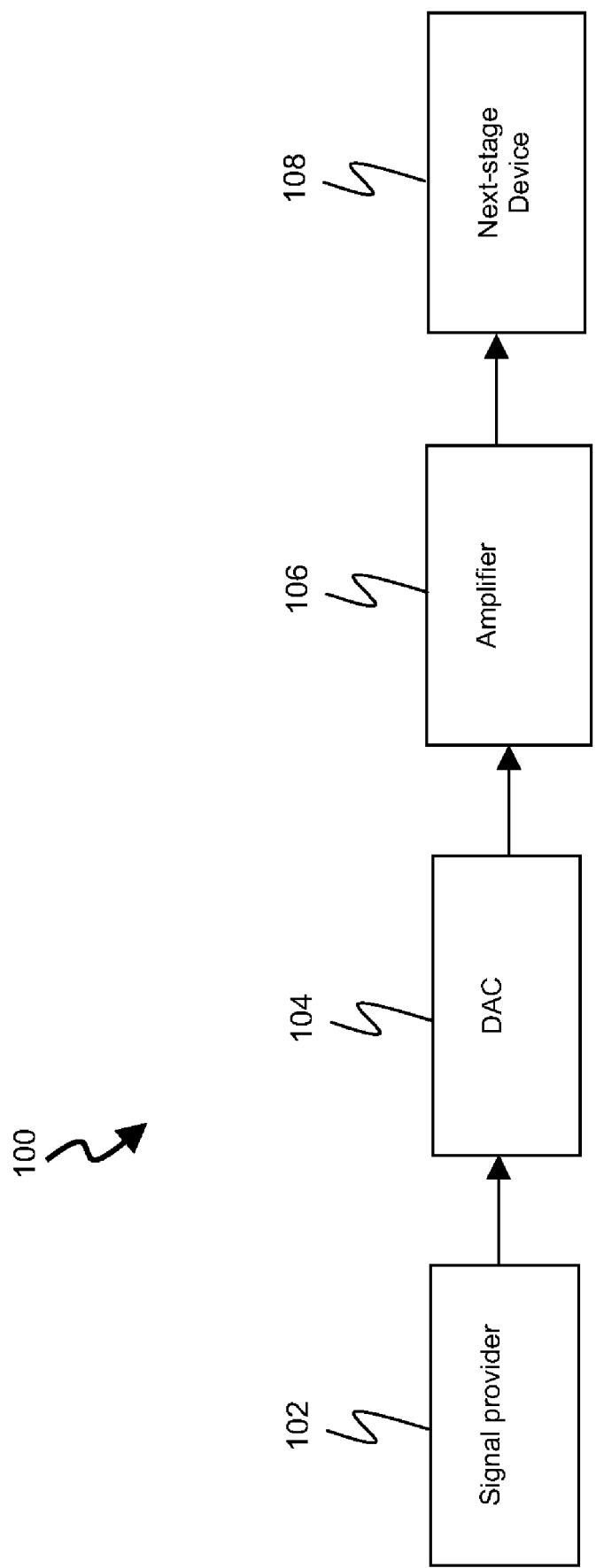
FIG. 1 shows a block diagram of the different key stages in audio signal amplification.

A voltage regulator and a method for biasing current-to-voltage amplifiers in which alternating current (AC) signal feedbacks are substantially eliminated are described hereinafter for addressing the foregoing problems.

For purposes of brevity and clarity, the description of the invention is limited hereinafter to applications related to devices for biasing current-to-voltage amplifiers. This does not however preclude various embodiments of the invention from other applications that require similar operating performance. The fundamental operational and functional principles of the embodiments of the invention are common throughout the various embodiments.

Exemplary embodiments of the invention described hereinafter are in accordance with FIGS. 1 to 3 of the drawings, in which like elements are numbered with like reference numerals.

FIG. 1 shows a block diagram of the different key stages in audio signal amplification. A signal provider 102 provides source signals to a digital-to-analog converter (DAC) 104. The signal provider 102 is preferably a digital audio device such as a CD-player or MP3 player that outputs digital signals. The DAC 104 then converts digital audio data retrieved from the source signals into current-based analog signals. The analog signals typically measure approximately in the range of few milliamperes (mA). Further, the output of the DAC 104 is biased with reference to an analog ground. The analog signals are then provided to an amplifier 106 in which the analog signals undergo signal amplification. Typically, the amplifier 106 is preferably operated in a desired operating region so as to obtain the required amplification characteristics. Based on the amplification characteristics of the amplifier 106, signal amplification is then performed within the linearity zone of the desired operating region. The amplified signals are then provided to a next-stage device 108 such as a pre-amplifier or a power-amplifier which further boosts the signal strength of the amplified signals for provision to subsequent output devices such as loudspeakers to be transduced into audible signals.

Figure 2:
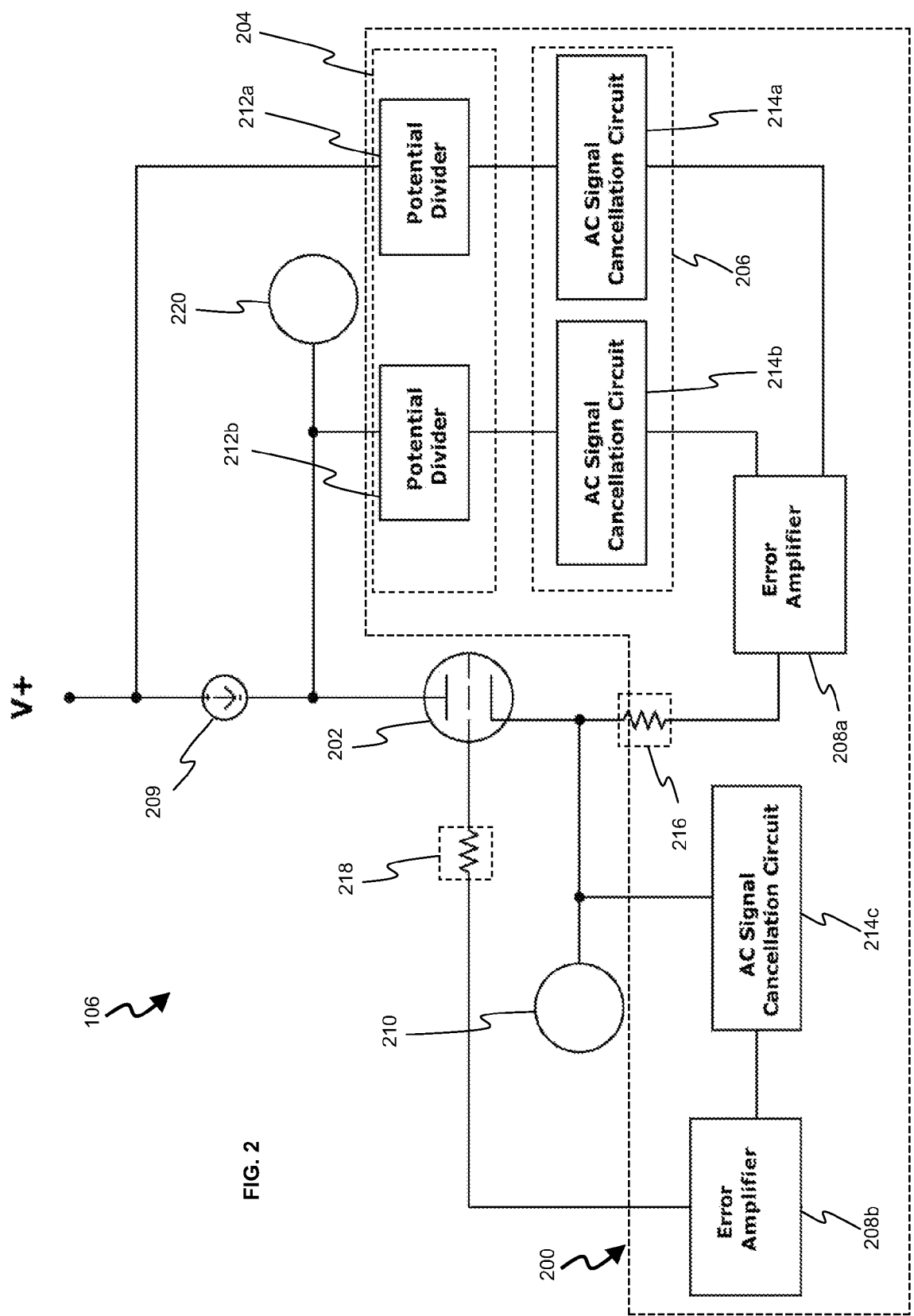
FIG. 2 shows a components block diagram representation of a circuit for biasing the current-to-voltage amplifier according to an embodiment of the invention.

FIG. 2 shows a components block diagram representation of a voltage regulator 200 according to an embodiment of the invention. The voltage regulator 200 is connected to a current-to-voltage amplifier 202 (hereinafter amplifier). Typically, the amplifier 202 is an analog amplifier and is implemented using a triode. The triode typically comprises three input terminals: an anode, a cathode and a grid. Alternatively, the amplifier 202 is implementable using circuit components such as field effect transistors, bipolar transistors or the like.

The voltage regulator 200 comprises a voltage reduction module 204, an AC signal cancellation module 206 and error amplifiers 208. As shown in FIG. 2, the voltage regulator 200 provides two biasing voltages to the amplifier 202. A current source 209 is connected to the anode of the amplifier 202 for providing low-output impedance. Further, the current source 209 is connected to a voltage source $V_+$ that preferably supplies a voltage having a value that exceeds one hundred and fifty volts. Further, the voltage source $V_+$ is also coupled to a first potential divider circuit 212a. In addition, a reference voltage $V_{ref}$ is provided to a second potential divider circuit 212b. The reference voltage $V_{ref}$ is preferably maintained at substantially half the value of the voltage provided by the voltage source $V_+$. Alternatively, the reference voltage $V_{ref}$ is maintained at any preset voltage value. The reference voltage $V_{ref}$ is also referenced from the second potential divider circuit 212b to the first potential divider circuit 212a by using the "voltage-mirroring" configuration. Hence, the first potential divider circuit 212a is also maintained at a voltage having the voltage value of the reference voltage $V_{ref}$ as well.

When input signals provided by the voltage source $V_+$ are received by the first potential divider circuit 212a, the input signals are then provided to a first AC signal cancellation circuit 214a for further processing. The first AC signal cancellation circuit 214a substantially removes any AC signals present in the input signals. Similarly, reference signals contained in the reference voltage $V_{ref}$ at the second potential divider circuit 212b are also sent to a second AC signal cancellation circuit 214b for processing to substantially remove the presence of any AC signals in the reference signals.

Both the processed input and reference signals are then fed into a first error amplifier 208a. The first error amplifier 208a functions as a signal compensator by comparing an input signal with a reference signal. Voltage differences between the input signal and the reference signal are then compensated for by the first error amplifier 208a. Hence, the first error amplifier 208a provides an output that is substantially free of AC signals to a load component 216 such as a resistor. Additionally, the voltage at the cathode of the amplifier 202 is maintained at approximately zero volts. Further, a biasing current flowing through the load component 216 is constantly regulated at a value approximately equal to the value provided by the current source 209 for optimal performance.

Due to the need to bias the amplifier 202 at the grid, it is undesirable to re-introduce any AC signals contained in input signals from a source 210 or other sources of noise to (or across) the amplifier 202. The source 210 is preferably a DAC that provides current-based analog signals. Alternatively, the source 210 is an alternating current (AC) source. Thus, the input signals from the source 210 are first provided to a third AC signal cancellation circuit 214c. The third AC signal cancellation circuit 214c removes any AC signals present in the input signals and minimizes possible re-introduction of AC signals back into the amplifier 202. The processed signals from the third AC signal cancellation circuit 214c are then provided to a second error amplifier 208b for compensating voltage differences. The second error amplifier 208b is referenced with respect to an analog ground. Notably, output signals from the second error amplifier 208b are substantially free of AC signals. Subsequently, the output signals from the second error amplifier 208b are then fed to the amplifier 202.

A grid resistor 218, coupled in between the amplifier 202 and the second error amplifier 208b, receives the output signals and provides a biasing voltage to the amplifier 202. The biasing voltage determines amplification characteristics of the amplifier 202. The amplifier 202 then provides output signals at an output 220 in which the output signals are amplified signal equivalents of the input signals based on the amplification characteristics of the amplifier 202. Furthermore, the output signals are also substantially distortion-free.

Figure 3:
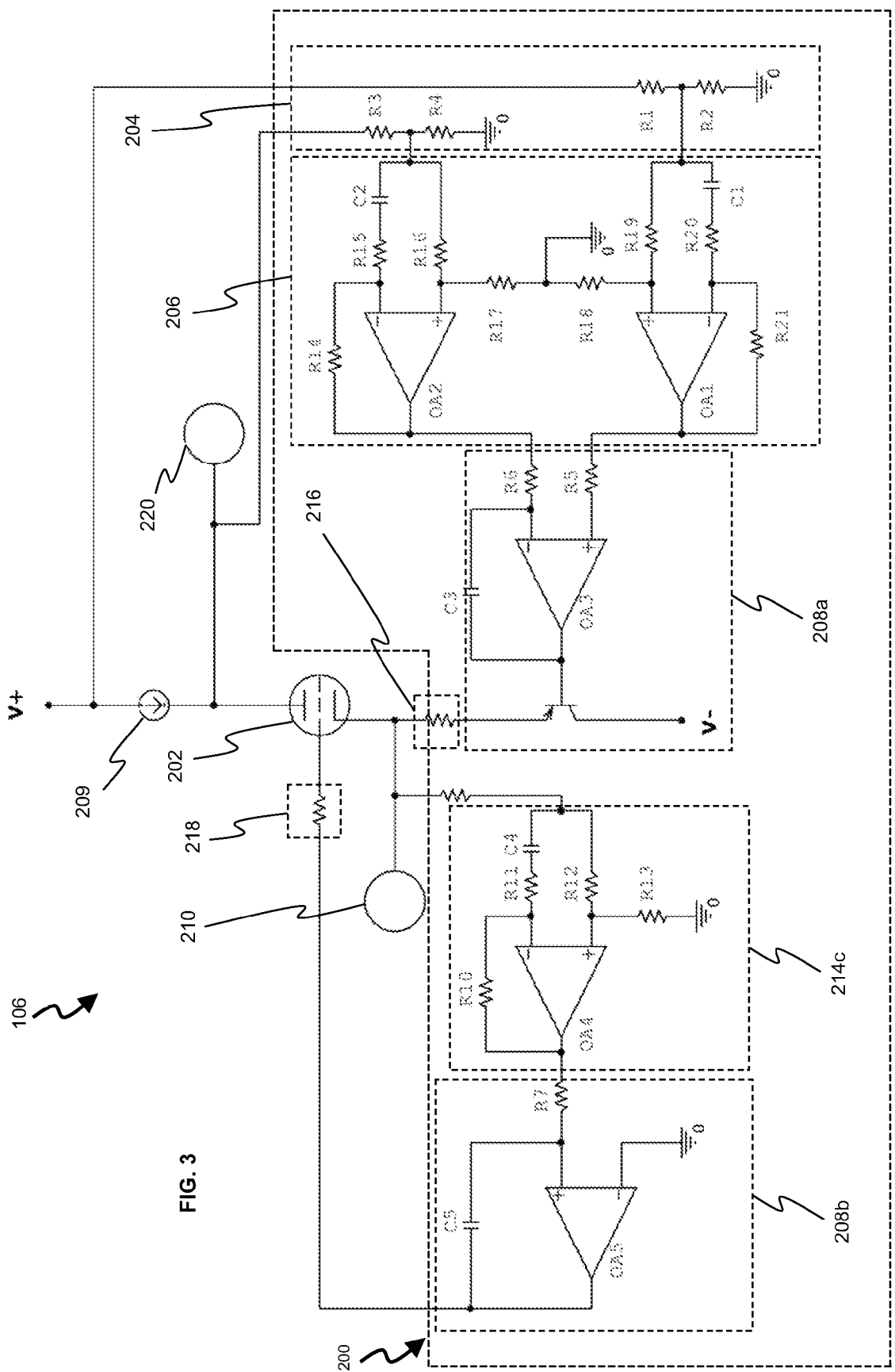
FIG. 3 shows a circuit diagram representation of the circuit of FIG. 2.

FIG. 3 shows a circuit diagram representation of the voltage regulator 200. As shown in FIG. 3, each of the first potential divider circuit 212a and second potential divider circuit 212b is constructed from a pair of resistors coupled in series for obtaining a reduced-voltage output across each of the resistors. The first potential divider circuit 212a is configured from resistors R1 and R2 and the second potential divider circuit 212b is configured from resistors R3 and R4.

The first AC signal cancellation circuit 214a and the second AC signal cancellation circuit 214b of the AC signal cancellation module 206 are configured using operational amplifiers (op-amps) in combination with other circuit components to form a subtractor-circuit (also known as a differential amplifier). For example, the first AC signal cancellation circuit 214a comprises op-amp OA1, capacitor C1 and resistors R18, R19, R20 and R21. Typically, a primary voltage signal comprising both AC and DC components ($V_{AC+DC}$) is provided to the non-inverting terminal of op-amp OA1. Separately, the inverting terminal of op-amp OA1 is provided only with a secondary voltage signal comprising only the AC component ($V_{AC}$). Hence, after the op-amp OA1 processes the primary voltage signal and secondary voltage signal, an output signal comprising only the DC component ($V_{DC}$) is produced. Separately, the second AC signal cancellation circuit 214b, comprising op-amp OA2, capacitor C2 and resistors R14, R15, R16 and R17, operates similarly as the first AC signal cancellation circuit 214a. In general, op-amps OA1 and OA2 each receives an equal proportion of the reduced-voltage output provided by the voltage reduction module 204 as a result of the high voltages provided by the voltage source $F_+$.

The first error amplifier 208a coupled to the AC signal cancellation module 206 is constructed from an op-amp OA3 that receives the outputs provided by the AC noise cancellation module 206. Resistors R5 and R6 are connected to the non-inverting and inverting terminals of op-amp OA3 in which resistors R5 and R6 are coupled in between the AC noise cancellation module 206 and op-amp OA3 for reducing the signal magnitude of the inputs received by the first error amplifier 208a. In addition, capacitor C3 couples the inverting terminal to the node point of the output of op-amp OA3. The output of op-amp OA3 serves to provide and regulate a biasing voltage to the load component 216.

Additionally, the third AC signal cancellation circuit 214c has a configuration similar to that of the first AC signal cancellation circuit 214a and the second AC signal cancellation circuit 214b. The third AC signal cancellation circuit 214c is configured as a subtractor-circuit comprising op-amp OA4, capacitor C4 and resistors R10, R11, R12 and R13.

Finally, the second error amplifier 208b comprises an op-amp OA5 with the inverting terminal being referenced to an electrical ground in which the source 210 is similarly being referenced to. The non-inverting terminal of op-amp OA5 is then coupled to capacitor C5, which in turn is coupled to the output of op-amp OA5. The output of op-amp OA5 is then connected to the grid resistor 218, which is in turn connected to the grid of the amplifier 202. Furthermore, a resistor R7 is coupled to the non-inverting terminal of op-amp OA5 at a node point before the output from the third AC signal cancellation circuit 214c is received by op-amp OA5.

In the foregoing manner, a voltage regulator and a method for biasing current-to-voltage amplifiers in which alternating current (AC) signal feedbacks are substantially eliminated are described according to various embodiments of the invention for addressing the foregoing disadvantages. Although a few embodiments of the invention are disclosed, it will be apparent to one skilled in the art in view of this disclosure that numerous changes and/or modification can be made without departing from the scope and spirit of the invention.

The invention claimed is:

1. A voltage regulator having a source signal input at which a first signal containing alternating current (AC) noise is providable and an output, the voltage regulator comprising:
    an analog amplifier having a first input, a second input, and a control input, the first input of the analog amplifier coupled to the voltage regulator output and the second input of the analog amplifier coupled to the source signal input of the voltage regulator;
    a noise filter having an input coupled to the source signal input of the voltage regulator and an output coupled to the control input of the analog amplifier, the input of the noise filter coupled to receive the first signal containing AC noise, the noise filter substantially filtering the AC noise and producing a second signal at its output; and
    a signal compensator disposed between the output of the noise filter and the control input of the analog amplifier, the signal compensator having an input coupled to receive the second signal and an output coupled to the analog amplifier, the signal compensator for regulating the second signal to generate a third signal the third signal being substantially noise-free, the third signal provided to the control input of the analog amplifier as a biasing voltage,
    wherein the first signal is amplified by the analog amplifier based on amplification characteristics of the analog amplifier, which are determined by the biasing voltage.

2. The voltage regulator as in claim 1, wherein the noise filter comprises:
    at least one of a plurality of resistors and a capacitor; and
    an operational amplifier, the at least one of a plurality of resistors and a capacitor, and the operational amplifier being configuratively arranged.

3. The voltage regulator as in claim 1, wherein the signal compensator comprises an operational amplifier.

4. The voltage regulator as in claim 1, wherein the analog amplifier is one of a triode, a field effect transistor and a bipolar transistor.

5. The voltage regulator as in claim 1, wherein the first signal is provided by one of a digital-to-analog converter (DAC) and an alternating current (AC) source.

6. The voltage regulator of claim 3, the signal compensator further comprises a resistor coupled to the operational amplifier.

7. A voltage regulating method for a voltage regulator having a source signal input at which a first signal containing alternating current (AC) noise is providable and an output, the voltage regulating method comprising:
    providing an analog amplifier having a first input, a second input, and a control input, the first input of the analog amplifier coupled to the voltage regulator output and the second input of the analog amplifier coupled to the source signal input of the voltage regulator;
    providing a noise filter having an input coupled to the source signal input of the voltage regulator and an output coupled to the control input of the analog amplifier, the input of the noise filter coupled to receive the first signal containing AC noise, the noise filter substantially filtering the AC noise and producing a second signal at its output; and
    providing a signal compensator disposed between the output of the noise filter and the control input of the analog amplifier, the signal compensator having an input coupled to receive the second signal and an output coupled to the analog amplifier, the signal compensator for regulating the second signal to generate a third signal, the third signal being substantially noise-free, the third signal provided to the control input of the analog amplifier as a biasing voltage,
    wherein the first signal is amplified by the analog amplifier based on amplification characteristics of the analog amplifier, which are determined by the biasing voltage.

8. The voltage regulating method as in claim 7, wherein the noise filter comprises:
    at least one of a plurality of resistors and a capacitor; and
    an operational amplifier, the at least one of a plurality of resistors and a capacitor, and the operational amplifier being configuratively arranged.

9. The voltage regulating method as in claim 7, wherein the signal compensator comprises an operational amplifier.

10. The voltage regulating method as in claim 7, wherein the analog amplifier is one of a triode, a field effect transistor and a bipolar transistor.

11. The voltage regulating method as in claim 7, wherein the first signal is provided by one of a digital-to-analog converter (DAC) and an alternating current (AC) source.

12. The voltage regulating method of claim 9, wherein the signal compensator further comprises a resistor coupled to the operational amplifier.

13. A voltage regulator having a source signal input and an output, the voltage regulator comprising:
    a current source having an input coupled to a first reference voltage and an output coupled to the voltage regulator output;
    an analog amplifier having a first input, a second input, and a control input, the first input of the analog amplifier coupled to the voltage regulator output;
    a load component having an input and an output, the output of the load component coupled to the second input of the analog amplifier;
    a first AC cancellation circuit having an input coupled to the source signal input of the voltage regulator and an output coupled to the control input of the analog amplifier; and
    an AC cancellation module having a first input coupled to the first reference voltage, a second input coupled to the voltage regulator output, and at least one output coupled to the load component input.

14. The voltage regulator of claim 13, further comprising a first error amplifier having an input coupled to the output of the first AC cancellation circuit and an output coupled to the control input of the analog amplifier.

15. The voltage regulator of claim 14, further comprising a second error amplifier having a first input coupled to a first output of the AC cancellation module, a second input coupled to a second output of the AC cancellation module, and an output coupled to the load component input.

16. The voltage regulator of claim 15, wherein the AC cancellation module comprises:
a second AC cancellation circuit having an input coupled to the first reference voltage and an output coupled to the first input of the second error amplifier; and
a third AC cancellation circuit having an input coupled to the current source output and an output coupled to second input of the second error amplifier.

17. The voltage regulator of claim 13, wherein the first AC cancellation circuit comprises a subtractor circuit.

18. The voltage regulator of claim 13, wherein the AC cancellation module comprises at least one subtractor circuit.

19. The voltage regulator of claim 13, wherein the AC cancellation module comprises a first and a second subtractor circuit that are each biased at a second reference voltage derived from the first reference voltage.

* * * * *